US012648228B2

(12) United States Patent
Forest et al.

(10) Patent No.: US 12,648,228 B2
(45) Date of Patent: Jun. 2, 2026

(54) ELECTRONIC CHIPS WITH SURFACE MOUNT COMPONENT

(71) Applicants:STMicroelectronics France, Montrouge (FR); STMicroelectronics (Alps) SAS, Grenoble (FR)

(72) Inventors: Jeremie Forest, Villard Bonnot (FR); Vincent Knopik, Crets en Belledonne (FR); Laurent Schwartz, La buisse (FR)

(73) Assignees: STMICROELECTRONICS FRANCE, Montrouge (FR); STMICROELECTRONICS (ALPS) SAS, Grenoble (FR)

( * ) Notice: Subject to any disclaimer, the term of this patent is extended or adjusted under 35 U.S.C. 154(b) by 586 days.

(21) Appl. No.: 17/457,203

(22) Filed: Dec. 1, 2021

(65) Prior Publication Data

US 2022/0181316 A1 Jun. 9, 2022

(30) Foreign Application Priority Data

Dec. 4, 2020 (FR) ...................................... 2012697

(51) Int. Cl.
| | |
|---|---|
| *H10D 89/10* | (2025.01) |
| *H10D 89/60* | (2025.01) |
| *H10W 42/20* | (2026.01) |

(52) U.S. Cl.
CPC .............. *H10D 89/10* (2025.01); *H10D 89/60* (2025.01); *H10W 42/20* (2026.01)

(58) Field of Classification Search
CPC .............. H01L 27/0207; H01L 27/0248; H01L 27/0292; H01L 2225/06537; H01L 23/552; H01L 23/3121; H01L 23/5223; H01L 23/5225; H01L 2924/3025; H01L 2924/19105; H01L 2224/48137; H01L 2224/32245; H01L 2224/48096; H01L 24/48; H01L 25/16; H05K 1/0231; H05K 1/023; H05K 1/056; H05K 1/0216
See application file for complete search history.

(56) References Cited

U.S. PATENT DOCUMENTS

| | | | | |
|---|---|---|---|---|
| 5,256,590 A | 10/1993 | Inoue | | |
| 2002/0027282 A1* | 3/2002 | Kawakami | .............. | C03C 3/062 |
| | | | | 257/E23.009 |
| 2002/0096779 A1* | 7/2002 | Feldtkeller | .............. | H01L 24/06 |
| | | | | 257/E23.044 |
| 2004/0068600 A1* | 4/2004 | Cranford, Jr. | ....... | H04L 25/0278 |
| | | | | 710/300 |

(Continued)

FOREIGN PATENT DOCUMENTS

| | | |
|---|---|---|
| CN | 101083256 A | 12/2007 |
| CN | 111564432 A | 8/2020 |

(Continued)

*Primary Examiner* — Teresa M. Arroyo
(74) *Attorney, Agent, or Firm* — Slater Matsil, LLP

(57) ABSTRACT

Electronic chip comprising a first integrated circuit, a second integrated circuit, a first link connecting the first integrated circuit and the second integrated circuit, a second link connecting the first integrated circuit and the second integrated circuit, a surface-mount component, the component being configured and placed to limit an electromagnetic disturbance by the first link of the second link.

20 Claims, 3 Drawing Sheets

(56)            References Cited

U.S. PATENT DOCUMENTS

| | | | |
|---|---|---|---|
| 2007/0289771 A1* | 12/2007 | Osaka | H01L 25/0655 |
| | | | 174/250 |
| 2010/0120204 A1 | 5/2010 | Kunimoto | |
| 2010/0224969 A1 | 9/2010 | Tang | |
| 2013/0214386 A1* | 8/2013 | Xie | H01L 21/565 |
| | | | 257/528 |
| 2013/0222327 A1* | 8/2013 | Cok | G06F 3/0446 |
| | | | 345/174 |
| 2014/0246778 A1* | 9/2014 | Okuni | H01L 24/06 |
| | | | 257/773 |
| 2015/0043171 A1* | 2/2015 | Mugiya | H01L 24/97 |
| | | | 361/728 |
| 2015/0287670 A1* | 10/2015 | Fukase | H01L 23/562 |
| | | | 361/813 |
| 2016/0205769 A1* | 7/2016 | Park | H01L 23/642 |
| | | | 174/260 |
| 2016/0300812 A1* | 10/2016 | Chen | H01L 23/3128 |
| 2018/0092257 A1* | 3/2018 | Otsubo | H05K 1/181 |
| 2018/0114741 A1* | 4/2018 | Gagné | H01L 23/66 |
| 2020/0176402 A1 | 6/2020 | Trang et al. | |
| 2020/0210803 A1* | 7/2020 | Ochi | H01Q 9/065 |
| 2020/0266178 A1* | 8/2020 | Lee | H01L 23/13 |
| 2021/0249360 A1* | 8/2021 | Honda | H01L 23/66 |
| 2021/0358859 A1* | 11/2021 | Chen | H01L 25/16 |

FOREIGN PATENT DOCUMENTS

| | | |
|---|---|---|
| CN | 217955855 U | 12/2022 |
| EP | 1715518 A1 | 10/2006 |
| JP | 2003332515 A | 11/2003 |

* cited by examiner

FIG. 2b

ELECTRONIC CHIPS WITH SURFACE MOUNT COMPONENT

CROSS-REFERENCE TO RELATED APPLICATIONS

This application claims priority to French Application No. 2012697 filed on Dec. 4, 2020, which application is hereby incorporated herein by reference.

TECHNICAL FIELD

This application relates to electronic chips, and in particular embodiments to surface mount components in electronic chips.

BACKGROUND

Electronic chips comprising several integrated circuits connected together by links are known.

These chips are used, for example, in telecommunications systems to carry out beamforming. These telecommunications systems can, for example, follow the standard 3GPP 5G. These systems comprise emitters and receivers that have electronic chips comprising several integrated circuits dedicated to various functions or to various pathways.

The various links must generally be insulated from each other, in order for the signals transmitted over a link to not disturb, via electromagnetic radiation, one of the other links.

However, the insulation possibilities are limited by the surface of the integrated circuits, the volume of the case of the chip and other constraints.

To carry out this insulation, the use of a metal plate placed between the electric links that must be insulated is known. This plate allows to limit the electromagnetic disturbances, in particular the magnetic field, by one of the links of the other links.

SUMMARY

For this purpose, according to embodiments of the invention, an electronic chip is provided. This electronic chip comprises a first integrated circuit, a second integrated circuit, a first link connecting the first integrated circuit and the second integrated circuit, a second link connecting the first integrated circuit and the second integrated circuit. The electronic chip comprises a surface-mount component, the component being configured and placed to limit an electromagnetic disturbance by the first link of the second link.

In this electronic chip, the links between the two integrated circuits are insulated from one another without requiring the presence of a metal plate. This insulation is carried out by the surface-mount component, which has two faces covered with a metal layer and thus allows the insulation between the two links.

Moreover, this surface-mount component is more stable than a metal plate and thus facilitates the step of injection of resin. Indeed, by its geometric shape, its volume and its footprint on the support, the surface-mount component can support a greater pressure by distributing it on the various faces of its volume.

In one embodiment, the first integrated circuit, the second integrated circuit and the component are fastened onto the same face of the same flat support. The component is fastened onto a zone of the flat support defined by the first link, the second link, an edge of the first integrated circuit and an edge of the second integrated circuit.

In one embodiment, the first link is formed by at least one first electric wire and the second link is formed by at least one second electric wire.

In one embodiment, the component is thicker than the first integrated circuit and than the second integrated circuit.

In one embodiment, a distance between the top of the component and the flat support is greater than a distance between the top of the first integrated circuit and the flat support and a distance between the top of the second integrated circuit and the flat support.

In one embodiment, the first link and the second link are contained in a volume comprised between the flat support and a plane extending from a face of the component, the face is parallel to the flat support and is the face farthest from the flat support.

In one embodiment, the component comprises a first metal surface layer facing the first link, a second metal surface layer facing the second link and an insulating layer placed between the first metal surface layer and the second metal surface layer.

In one embodiment, the component is a first surface-mount component, the electronic chip comprises a second surface-mount component placed on the first component. The first component and the second component are configured to cooperate in order to limit the electromagnetic disturbance.

In one embodiment, the second component comprises a first metal surface layer facing the first link, a second metal surface layer facing the second link and an insulating layer placed between the first metal surface layer of the second component and the second metal surface layer of the second component.

In one embodiment, the first metal surface layer of the first component is coplanar to the first metal surface layer of the second component and the second metal surface layer of the first component is coplanar to the second metal surface layer of the second component.

BRIEF DESCRIPTION OF THE DRAWINGS

Other features, goals and advantages of the invention will be clear from the following description, which is purely illustrative and non-limiting and which must be read in reference to the appended drawings in which:

FIGS. 1a to 1c show an electronic chip according to the invention, wherein FIG. 1a illustrates a partial projection view, FIG. 1b illustrates a cross-sectional view, and FIG. 1c illustrates another a magnified top view; and FIGS. 2a and 2b show an electronic chip according to the invention, wherein FIG. 2a illustrates a partial projection view, and FIG. 2b illustrates a cross-sectional view.

DETAILED DESCRIPTION OF ILLUSTRATIVE EMBODIMENTS

Conventional techniques using mounting of a metal plate is complicated to carry out, in particular since this plate must not move during the injection of resin used to create the case. This involves the addition of steps during the creation of the case and increases its cost.

Embodiments described herein provide a new type of electronic chip comprising an insulation device between links connecting two integrated circuits that does not have the complexity of production of the current devices.

Figure 1A:
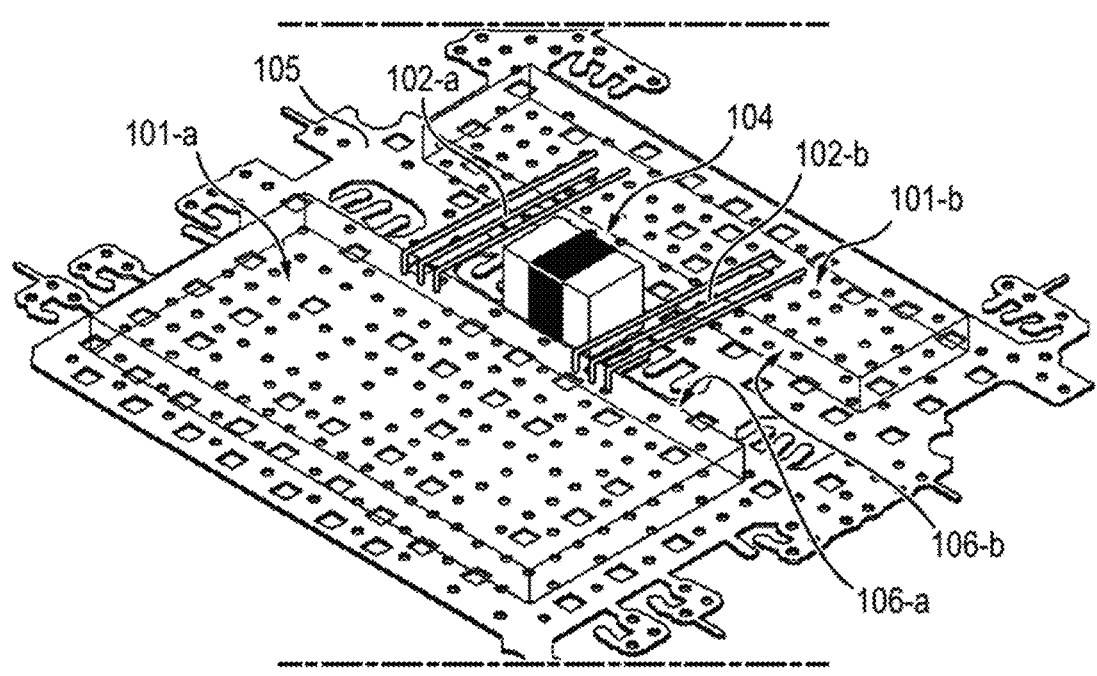
Figure 1B:
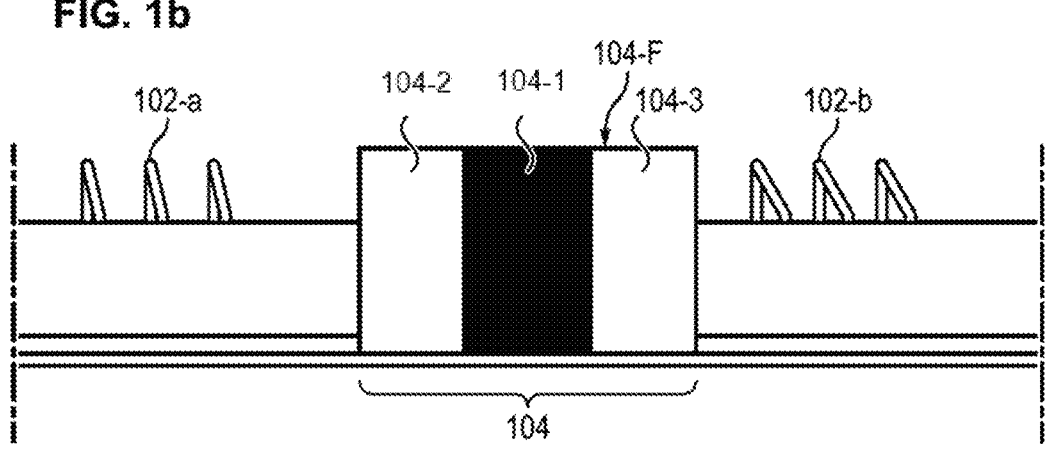
Figure 1C:
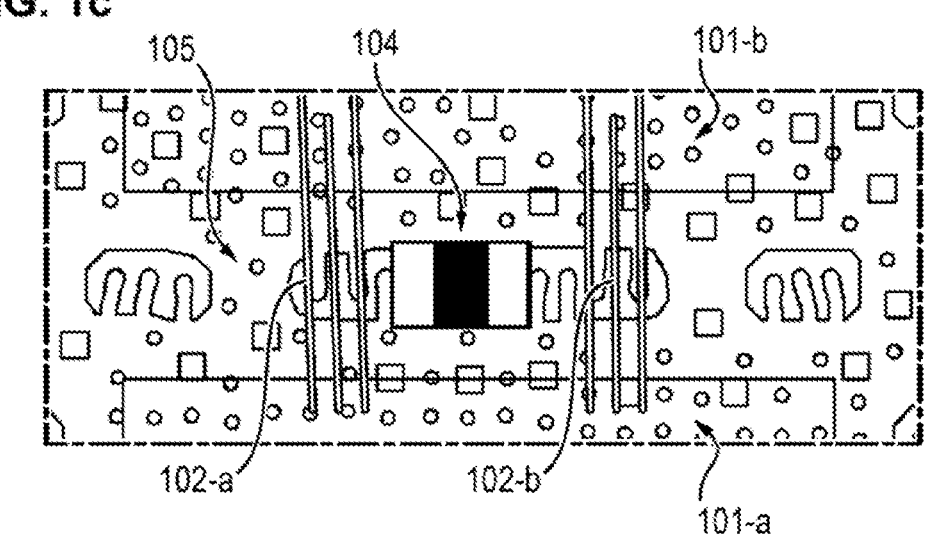

FIGS. 1a to 1c show a part of an electronic chip. This chip comprises a first integrated circuit 101-a and a second integrated circuit 101-b. These two circuits 101-a and 101-b are connected by a first electric link 102-*a* and a second electric link 102-*b*. The chip also comprises a component of the surface-mount type 104 (SMD). This component 104 has a parallelepipedic shape. It comprises a sandwich of a layer of electric insulating material 104-1, for example ceramic, surrounded by a first metal surface layer 104-2 and a second metal surface layer 104-3, for example copper. One of the metal surface layers is facing one of the links and the other is facing the other link.

The first circuit 101-*a*, the second circuit 101-*b* and the component 104 are mounted and fastened onto the same face of the same flat support 105 (slug). The component 104 is, for example, brazed or welded onto the support 105. The component 104 is fastened onto a rectangular zone of the flat support 105 defined by the first link 102-*a*, the second link 102-*b*, an edge 106-*a* of the first circuit 101-*a* and an edge 106-*b* of the second circuit 101-*b*.

The component 104 is configured and placed to limit an electromagnetic disturbance, generated by a signal transmitted via the first link 102-*a*, of the second link 102-*b*. To do this the component 104 is placed between the first link 102-*a* and the second link 102-*b*.

To do this, the component can be configured and placed in order for one or both of the metal surface layers 104-2 or 104-3 to be placed as a cutoff between the first link 102-*a* and the second link 102-*b*.

To do this, the component 104 can be thicker than the first circuit 101-*a* and than the second circuit 101-*b*.

To do this, the component 104 can be configured in order for a distance between the support 105 and the top of the component 104 to be greater than a distance between the support 105 and the top of the first circuit 101-*a* and than a distance between the support 105 and the top of the second circuit 101-*b*.

To do this, the component 104 can be configured in order for the first link 102-*a* and the second link 102-*b* to be contained in a volume comprised between the support 105 and a plane extending from the face 104-F of the component 104 parallel to the support 105 and farthest from the support 105.

Various types of surface-mount components can be used. However, it is advantageous to use a capacitor since it behaves like an open circuit with respect to a DC current.

The first link 102-*a* and the second link 101-*b* can be formed by electric wires (Wire Bonding).

Figure 2A:
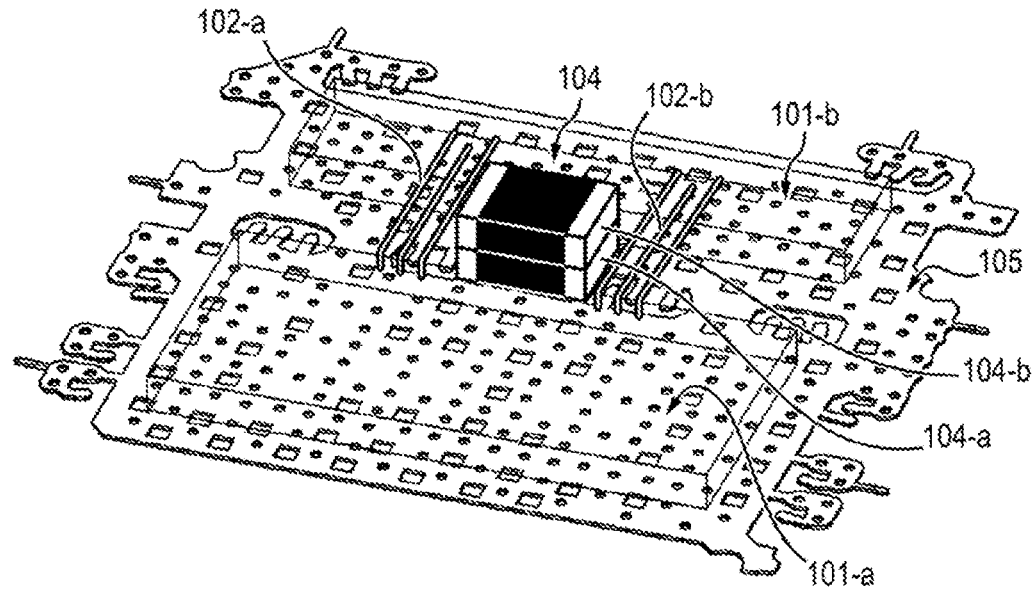
Figure 2B:
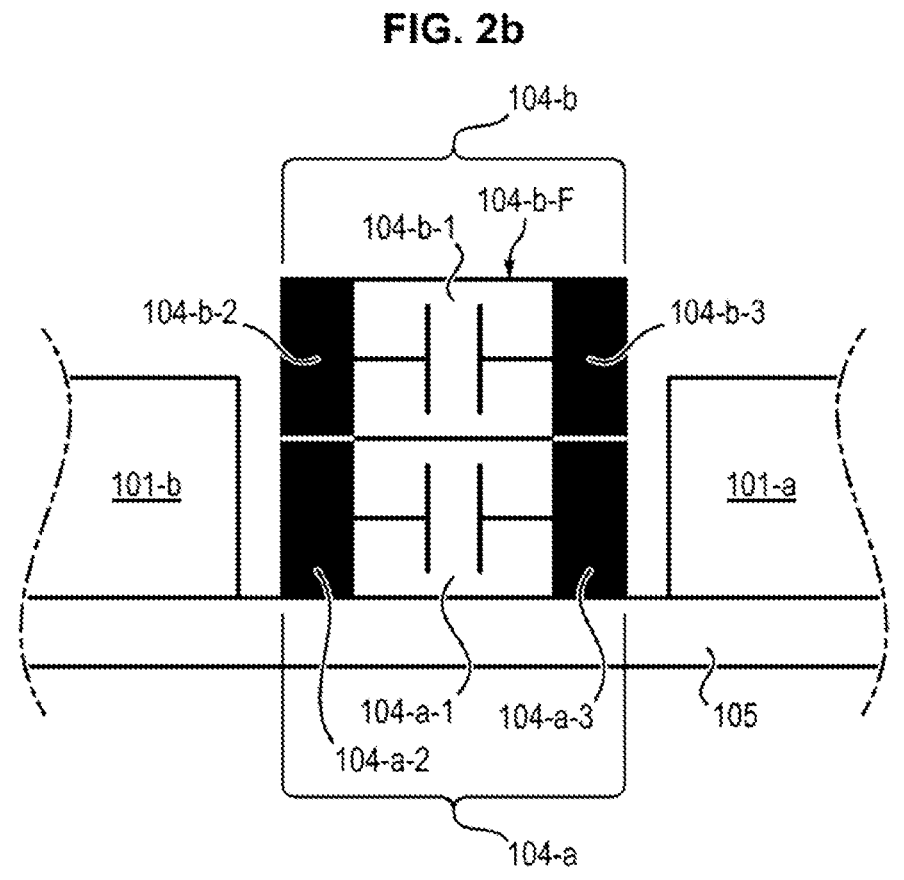

FIGS. 2*a* and 2*b* show another embodiment in which a first surface-mount component 104-*a* and a second first surface-mount component 104-*b* are placed one on the other. This embodiment allows to double the thickness and to thus allow a greater limitation of the electromagnetic disturbances by one of the links of another link. Hereinafter it is considered that the first component 104-*a* is placed on the support 105 and that the second component 104-*b* is placed on the first component 104-*a*.

To do this, the combination of the two components 104-*a* and 104-*b* can be thicker than the first circuit 101-*a* and than the second circuit 101-*b*.

To do this, the combination of the two components 104-*a* and 104-*b* can be configured in order for a distance between the flat support 105 and the top of the combination to be greater than a distance between the flat support 105 and the top of the first circuit 101-*a* and than a distance between the flat support 105 and the top of the second circuit 101-*b*.

To do this, the combination of the two components 104-*a* and 104-*b* can be configured in order for the first link 102-*a* and the second link 102-*b* to be contained in a volume comprised between the flat support 105 and a plane extending from the face 104-*b*-F of the second component 104-*b* parallel to the flat support 105 and farthest from the flat support 105.

The second component 104-*b* also comprises a layer of insulating material 104-*b*-1 surrounded by a first metal surface layer 104-*b*-2 and a second metal surface layer 104-*b*-3.

In this embodiment the first metal surface layer 104-*a*-2 of the first component 104-*a* is in the continuity of and coplanar to the first metal surface layer 104-*b*-2 of the second component 104-*b*.

Likewise the second metal surface layer 104-*a*-3 of the first component 104-*a* is in the continuity of and coplanar to the second metal surface layer 104-*b*-3 of the second component 104-*b*.

What is claimed is:

1. An electronic chip comprising:
   a first integrated circuit;
   a second integrated circuit;
   a first link configured to transmit a first signal and connecting the first integrated circuit and the second integrated circuit;
   a second link configured to transmit a second signal and connecting the first integrated circuit and the second integrated circuit; and
   a surface-mount component disposed between but not directly connected to the first and second links,
   wherein the first link and the second link are partially disposed on opposite sides of the surface-mount component,
   wherein the surface-mount component, the first integrated circuit, and the second integrated circuit are directly mounted on a first face of a flat support, and
   wherein each of the first link and the second link is directly connected to the first and second integrated circuits and contained within a volume between the first face of the flat support and a plane extending from a top face of the surface-mount component that is farthest from and parallel to the flat support.

2. The electronic chip according to claim 1, wherein the first link comprises at least one first electric wire, and the second link comprises at least one second electric wire.

3. The electronic chip according to claim 1, wherein the surface-mount component is thicker than:
   the first integrated circuit, and
   the second integrated circuit.

4. The electronic chip according to claim 1, the surface-mount component comprising:
   a first metal surface layer facing the first link,
   a second metal surface layer facing the second link, and
   an insulating layer disposed between the first metal surface layer and the second metal surface layer.

5. The electronic chip according to claim 1, wherein the surface-mount component is configured to limit an electromagnetic disturbance of the second link by the first link.

6. The electronic chip according to claim 5, wherein the surface-mount component comprises a first surface-mount component, and a second surface-mount component disposed on the first surface-mount component, and wherein the first surface-mount component and the second surface-mount component are configured to cooperate in order to limit the electromagnetic disturbance.

7. The electronic chip according to claim 1, the surface-mount component having an uppermost surface above the first link and the second link.

8. An electronic chip comprising:
   a first integrated circuit;

a second integrated circuit;

a first link configured to transmit a first signal and connecting the first integrated circuit and the second integrated circuit;

a second link configured to transmit a second signal and connecting the first integrated circuit and the second integrated circuit; and a surface-mount component, wherein the first integrated circuit, the second integrated circuit, and the surface-mount component are directly fastened onto a first face of a flat support, wherein the surface-mount component is fastened within a four-sided zone of the flat support defined by the first link, the second link, a first edge of the first integrated circuit, and a second edge of the second integrated circuit, and wherein each of the first link and the second link is directly connected to the first and second integrated circuits and contained within a volume between the first face of the flat support and a plane extending from a top face of the surface-mount component that is farthest from and parallel to the flat support.

9. The electronic chip according to claim 8, wherein a first distance between the top face of the surface-mount component and the first face of the flat support is greater than:

a second distance between a first top of the first integrated circuit and the first face of the flat support, and a third distance between a second top of the second integrated circuit and the first face of the flat support.

10. The electronic chip according to claim 8, wherein the surface-mount component is configured to limit an electromagnetic disturbance of the second link by the first link.

11. The electronic chip according to claim 8, the surface-mount component comprising:

a first metal surface layer facing the first link, a second metal surface layer facing the second link, and an insulating layer disposed between the first metal surface layer and the second metal surface layer.

12. An electronic chip comprising:

a substrate;

a first integrated circuit directly attached to a first side of the substrate;

a second integrated circuit directly attached to the first side of the substrate;

a first electrical signal connection located above the first side of the substrate and directly interconnecting the first integrated circuit with the second integrated circuit;

a second electrical signal connection located above the first side of the substrate and directly interconnecting the first integrated circuit with the second integrated circuit;

a first surface-mount component directly attached to the first side of the substrate, wherein the first surface-mount component is disposed between but not directly connected to the first electrical signal connection and the second electrical signal connection, wherein the first electrical signal connection and the second electrical signal connection are partially disposed on opposite sides of the first surface-mount component; and a second surface-mount component attached to the first surface-mount component but not directly connected to the first electrical signal connection and the second electrical signal connection, wherein the first surface-mount component is disposed between the first side of the substrate and the second surface-mount component, and wherein the second surface-mount component has a second uppermost surface above the first electrical signal connection and the second electrical signal connection.

13. The electronic chip according to claim 12, the first surface-mount component having a first uppermost surface below a third uppermost surface of the first integrated circuit and a fourth uppermost surface of the second integrated circuit.

14. The electronic chip according to claim 13, wherein the second uppermost surface of the second surface-mount component is above the third uppermost surface of the first integrated circuit and the fourth uppermost surface of the second integrated circuit.

15. The electronic chip according to claim 12, the first surface-mount component comprising:

a first metal surface layer facing the first electrical signal connection, a second metal surface layer facing the second electrical signal connection, and a first insulating layer isolating the first metal surface layer from the second metal surface layer.

16. The electronic chip according to claim 15, the second surface-mount component comprising:

a third metal surface layer facing the first electrical signal connection, a fourth metal surface layer facing the second electrical signal connection, and a second insulating layer isolating the third metal surface layer from the fourth metal surface layer.

17. The electronic chip according to claim 16, wherein the first metal surface layer is aligned with the third metal surface layer, the second metal surface layer is aligned with the fourth metal surface layer, and the first insulating layer is aligned with the second insulating layer.

18. The electronic chip according to claim 16, wherein the first metal surface layer is electrically coupled with and coplanar to the third metal surface layer, the second metal surface layer is electrically coupled with and coplanar to the fourth metal surface layer.

19. The electronic chip according to claim 16, wherein the first surface-mount component and the second surface-mount component together are configured to limit electromagnetic disturbance of the second electrical signal connection by the first electrical signal connection.

20. The electronic chip according to claim 16, the first surface-mount component and the second surface-mount component substantially filling a distance between the first integrated circuit and the second integrated circuit.

* * * * *